(12) United States Patent
Park et al.

(10) Patent No.: US 9,293,468 B2
(45) Date of Patent: Mar. 22, 2016

(54) NONVOLATILE MEMORY DEVICE

(71) Applicant: SK hynix Inc., Gyeonggi-do (KR)

(72) Inventors: Sung-Kun Park, Gyeonggi-do (KR);
Young-Jun Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/533,821

(22) Filed: Nov. 5, 2014

(65) Prior Publication Data

US 2015/0054053 A1    Feb. 26, 2015

Related U.S. Application Data

(63) Continuation-in-part of application No. 13/830,983, filed on Mar. 14, 2013.

(30) Foreign Application Priority Data

Nov. 30, 2012 (KR) .................... 10-2012-0137637

(51) Int. Cl.
| | |
|---|---|
| H01L 29/76 | (2006.01) |
| H01L 29/792 | (2006.01) |
| H01L 29/788 | (2006.01) |
| H01L 29/78 | (2006.01) |
| H01L 21/762 | (2006.01) |
| H01L 21/336 | (2006.01) |
| H01L 27/115 | (2006.01) |
| H01L 29/423 | (2006.01) |

(52) U.S. Cl.
CPC .... H01L 27/11521 (2013.01); H01L 27/11519 (2013.01); H01L 29/42324 (2013.01); H01L 29/7881 (2013.01)

(58) Field of Classification Search
CPC .................. H01L 27/11521; H01L 27/11519; H01L 29/7883; H01L 29/42324; H01L 29/7881

USPC .................................................. 257/310–320
See application file for complete search history.

(56) References Cited

U.S. PATENT DOCUMENTS

| | | | |
|---|---|---|---|
| 6,151,248 A | 11/2000 | Harari et al. | |
| 7,894,257 B1 * | 2/2011 | Prabhakar | ................ 365/185.01 |
| 2005/0199936 A1 * | 9/2005 | Wang | ................. G11C 16/0433 257/314 |
| 2008/0135913 A1 * | 6/2008 | Sugino et al. | ................. 257/316 |
| 2009/0194806 A1 * | 8/2009 | Nam | ................... G11C 16/0433 257/322 |
| 2009/0267127 A1 * | 10/2009 | Chen et al. | ..................... 257/314 |
| 2010/0165700 A1 * | 7/2010 | Park | ................... G11C 16/0425 365/104 |
| 2011/0044112 A1 * | 2/2011 | Torii | ................... G11C 16/0433 365/185.18 |
| 2013/0237048 A1 * | 9/2013 | Hsu et al. | ...................... 438/593 |

OTHER PUBLICATIONS

Office Action issued by the USPTO for the parent U.S. Appl. No. 13/830,983 on May 20, 2015.
Office Action issued by the USPTO for the parent U.S. Appl. No. 13/830,983 on Jun. 6, 2014.
Office Action issued by the USPTO for the parent U.S. Appl. No. 13/830,983 on Nov. 20, 2014.

* cited by examiner

*Primary Examiner* — Howard Weiss
*Assistant Examiner* — Nelson Garces
(74) *Attorney, Agent, or Firm* — IP & T Group LLP (57) ABSTRACT

A nonvolatile memory device includes a tunneling region and an erase region formed over a substrate, a selection gate formed over the substrate to overlap with the tunneling region, a floating gate formed over the substrate to be disposed adjacent to the selection gate with a gap therebetween and to overlap with the tunneling region and the erase region, and a charge blocking layer filling the gap.

13 Claims, 4 Drawing Sheets

NONVOLATILE MEMORY DEVICE

CROSS-REFERENCE TO RELATED APPLICATIONS

The present application is a continuation-in-part of U.S. patent application Ser. No. 13/830,983, filed on Mar. 14, 2013, which claims priority of Korean Patent Application No. 10-2012-0137637, filed on Nov. 30, 2012. Each of these applications is incorporated herein by reference in its entirety.

BACKGROUND

1. Field

Exemplary embodiments of the present invention relate to a semiconductor device fabrication technology, and more particularly, to a nonvolatile memory device and a method of fabricating the same.

2. Description of the Related Art

A life environment is being changed such that anyone may conveniently use desired information anytime and anywhere, employing recently developed digital media devices. As a conversion is made from analog to digital, a variety of rapidly spreading digital type devices have required storage media that may conveniently store captured images, recorded music and various data. In order to meet this requirement, there is a growing interest in the field of a system-on-chip (SoC) according to a tendency for a high degree of integration of non-memory semiconductors, and semiconductor manufacturers compete to invest in the field of an SoC in an effort to strengthen an SoC-based technology. An SoC means that system technologies are integrated in one semiconductor. If a system design technology is not secured, it may be difficult to develop non-memory semiconductors. A chip having complex functions of a digital circuit and an analog circuit is emerging as a mainstream technology in the field of SoC where complicated technologies are integrated.

This increases the necessity for an embedded memory for trimming an analog device or storing an internal computation algorithm.

SUMMARY

Various exemplary embodiments of the present invention are directed to a nonvolatile memory device that may have improved integration degree and operation characteristics.

In accordance with an exemplary embodiment of the present invention, a nonvolatile memory device includes a tunneling region and an erase region formed over a substrate, a selection gate formed over the substrate to overlap with the tunneling region, a floating gate formed over the substrate to be disposed adjacent to the selection gate with a gap therebetween and to overlap with the tunneling region and the erase region, and a charge blocking layer filling the gap.

In accordance with another exemplary embodiment of the present invention, a nonvolatile memory device includes a plurality of tunneling regions that are extended in a first direction and arranged to be spaced apart from each other in a second direction intersecting with the first direction, a plurality of erase regions disposed between the tunneling regions, in the second direction, and a plurality of gate lines that are extended in the second direction and arranged to be spaced apart from each other in the first direction, wherein each of the gate lines includes a selection gate intersecting with the tunneling regions, a plurality of floating gates disposed to be adjacent to the selection gate with a gap therebetween and to overlap with the tunneling regions and the erase regions, and a charge blocking layer filling the gap.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also n something with an intermediate feature(s) or a layer(s) therebetween, and that "over" means not only directly on top but also on top of something with an intermediate feature(s) or a layer(s) therebetween, It is also noted that in this specification, "connected/coupled" refers to one component not only directly coupling another component but also indirectly coupling another component through an intermediate component. In addition, a singular form may include a plural form as long as it is not specifically mentioned in a sentence.

The following embodiments of the present invention provide a nonvolatile memory device that may be readily applicable to an embedded memory, To be specific, the embodiments of the present invention provide a nonvolatile memory device that has an integration degree more improved than that of a single gate Electrically Erasable Programmable Read-Only Memory (EEPROM) in a flash EEPROM, which is spotlighted among embedded memories, and includes selection gates for preventing over-erase.

For reference, because, in a single gate EEPROM that generally known in the art, a structure such as a well formed in a substrate is used to couple a floating gate, there is limitation in increasing the degree of integration. On the contrary, all of a stack gate EEPROM in which a floating gate and a control gate are vertically stacked, a dual gate EEPROM in which a control gate and a floating gate are disposed side by side, and a split gate EEPROM in which a control gate covers one side of a floating gate so that the control gate couples the floating gate, are additionally provided with a control gate for coupling the floating gate, they may have excellent degree of integration compared with the single gate EEPROM. However, since a procedural step for forming the additional control gate has to be added, there is a drawback of deteriorated productivity, which is caused due to the increased number of procedural steps. Moreover, when a selection gate for preventing an over-erase is added to the single gate EEPROM that is generally known in the art, the stack gate EEPROM, the dual gate EEPROM, and the split gate EEPROM, the degree of integration is deteriorated remarkably, In consideration of these facts, the embodiments of the present invention that will be described below provide a non-volatile memory device that has a floating gate and a selection gate with an over-erase preventing function, where the selection gate may function as a control gate for coupling the floating gate. In this way, the nonvolatile memory device may have remarkably increased degree of integration and the operation characteristics.

Meanwhile, in the following descriptions, a first conductivity type and a second conductivity type are complementary conductivity types to each other. Namely, if the first conductivity type is a P type, the second conductivity type is an N type, and, if the first conductivity type is an N type, the second conductivity type is a P type. This means that the nonvolatile memory device in accordance with embodiments of the present invention may be of an N-channel type or a P-channel type. Hereinafter, for the sake of convenience in explanation, the first conductivity type will be described as a P type and the second conductivity type will be described as an N type, That is to say, descriptions will be made below by exemplifying an N-channel type nonvolatile memory device.

Figure 1:
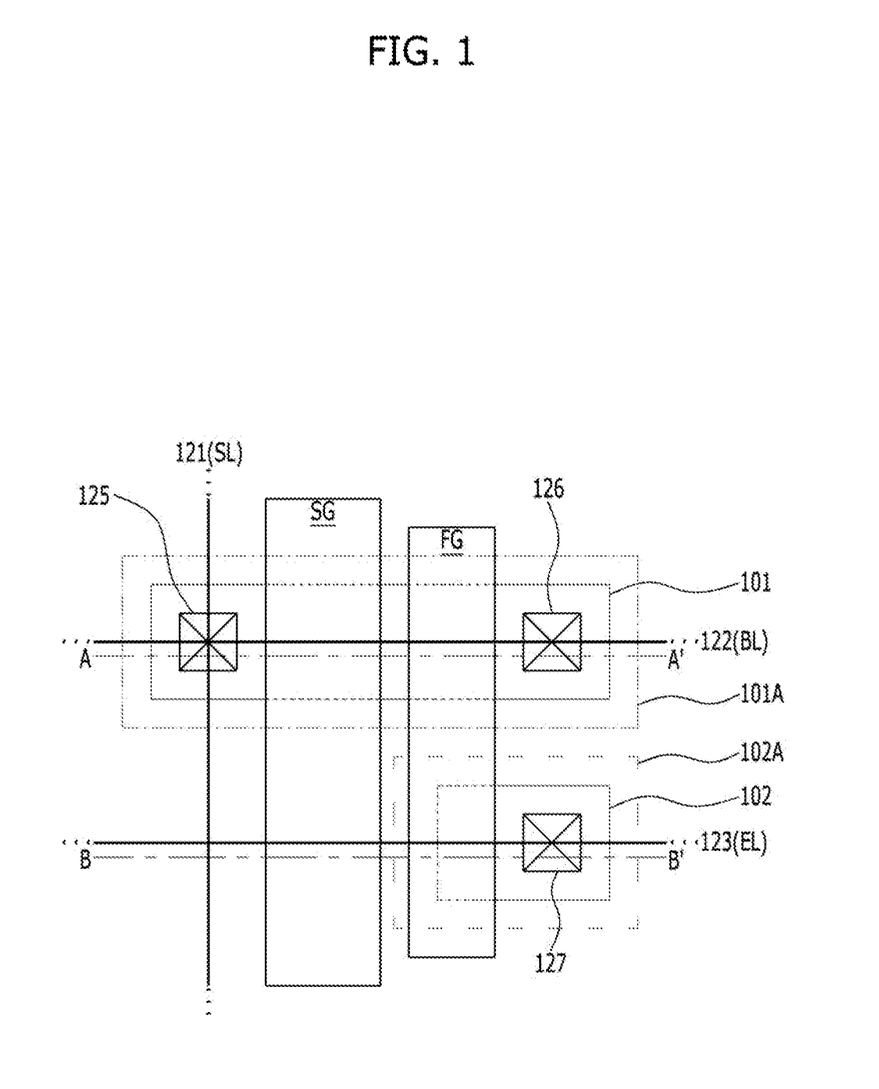
FIG. 1 is a plan view illustrating a unit cell of a nonvolatile memory device in accordance with an embodiment of the present invention.
Figure 2A:
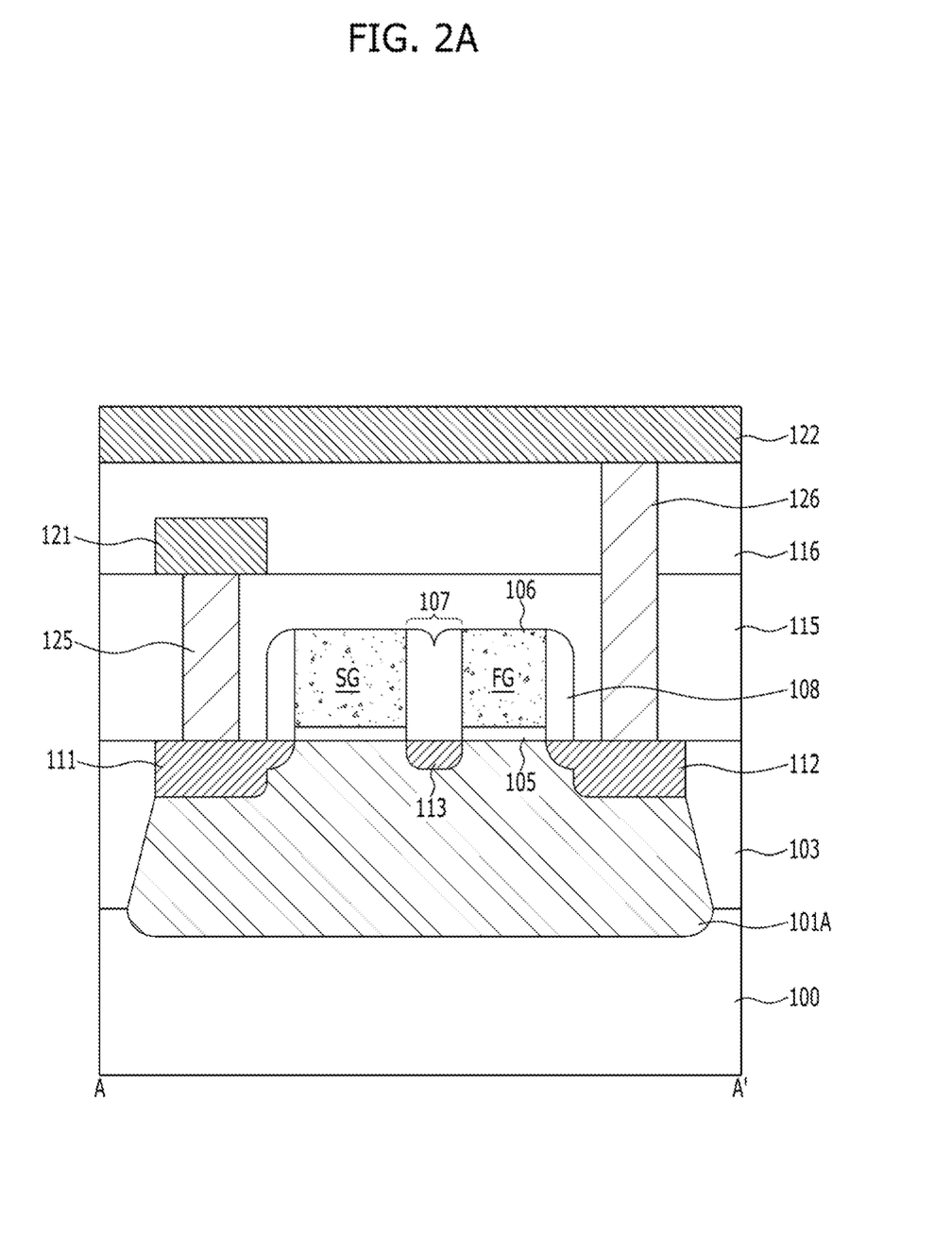
FIGS. 2A and 2B are cross-sectional views illustrating the unit cell taken along the A-A' line and the B-B' line, shown in FIG. 1, respectively.
Figure 2B:
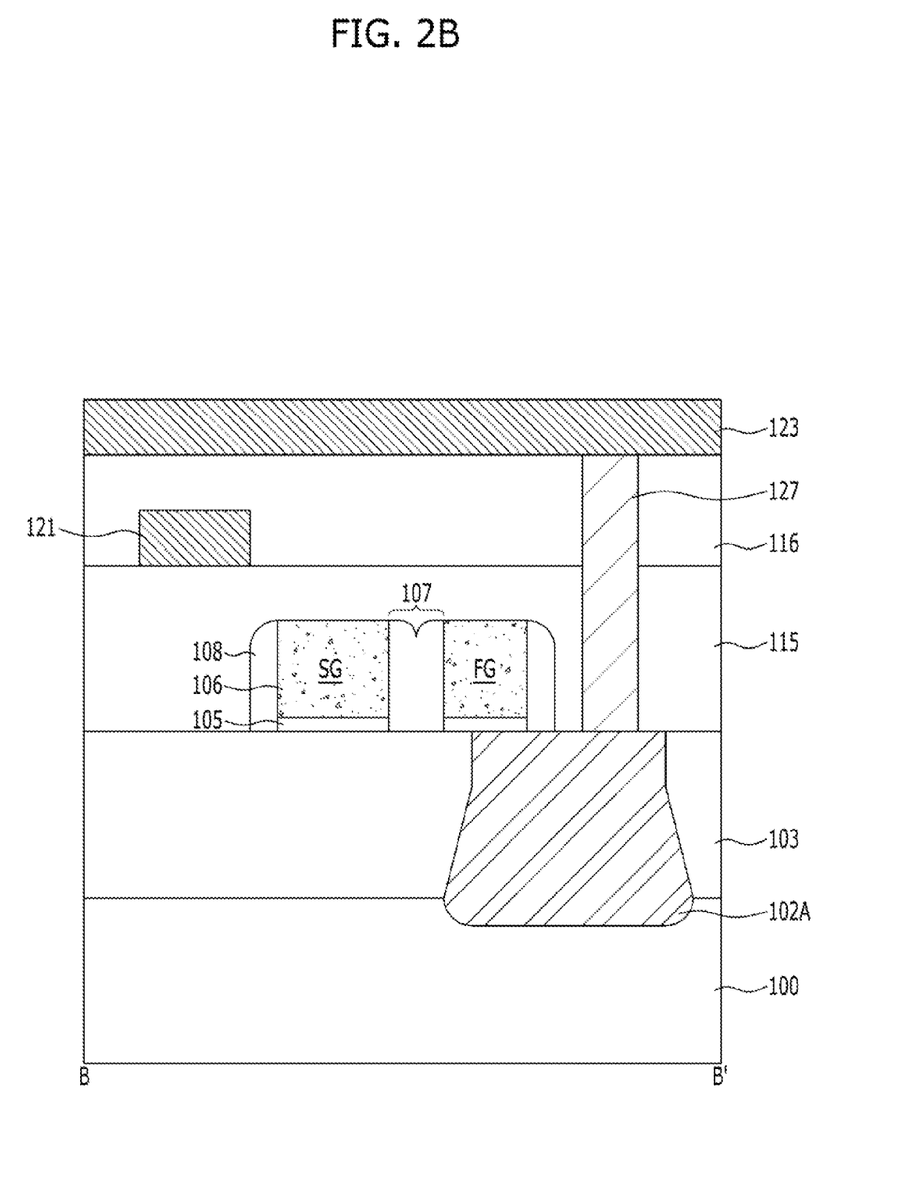

FIG. 1 is a plan view illustrating a unit cell of a nonvolatile memory device in accordance with an embodiment of the present invention. FIGS. 2A and 2B are cross-sectional views illustrating the unit cell taken along the A-A' line and the B-B' line, shown in FIG. 1, respectively.

Referring to FIGS. 1, 2A and 2B the nonvolatile memory device in accordance with an embodiment of the present invention may include a substrate 100, a selection gate SG, and a floating gate FG. The substrate 100 includes a tunneling region 101 and an erase region 102. The selection gate SG is formed over the substrate 100 to overlap with the tunneling region 101. The floating gate FG is disposed adjacent to the selection gate SG with a gap 107 and overlaps with the tunneling region 101 and the erase region 102. Herein, the floating gate FG may be coupled in response to a bias applied to the selection gate SG, and may erase a memory cell through a Fowler-Nordheim (FN) tunneling scheme.

Hereafter, the constituent elements of the nonvolatile memory device in accordance with the embodiment of the present invention are described in detail.

The nonvolatile memory device in accordance with the embodiment of the present invention may include an isolation layer 103, a first well 101A and a second well 102A. The isolation layer 103 is formed in the substrate 100 and defines the tunneling region 101 and the erase region 102. The first well 101A is of a first conductive type and formed in the substrate 100 corresponding to the tunneling region 101. The second well 102A is of a second conductive type and formed in the substrate 100 corresponding to the erase region 102. Also, although not illustrated in the drawing, the nonvolatile memory device may include a deep well of the second conductive type, which includes the first well 101A and the second well 102A.

The substrate 100 may be a semiconductor substrate, which may be of a single crystalline state and may include a silicon-containing material. In other words, the semiconductor substrate in may include a monocrystalline silicon-containing material. For example, the substrate 100 may be a bulk silicon substrate, or a silicon-on-insulator (SOI) substrate in which a supporting substrate, a buried dielectric layer and a single crystalline silicon layer are sequentially stacked.

The isolation layer 103 may be formed through a shallow trench isolation (STI) process. To be specific, the isolation layer 103 may include an isolation trench formed in the substrate 100 and a dielectric substance for gap-filling the isolation trench. The bottom surface of the isolation layer 103 may be laid over the bottom surfaces of the first well 101A and the second well 102A.

The tunneling region 101 is a region where a program operation and a read operation of a memory cell are performed. The erase region 102 is a region where an erase operation of a memory cell is performed. The tunneling region 101 may be of a bar type or a line type. The erase region 102 may have diverse shapes, such as a polygon over triangle and circle.

The first well 101A and the second well 102A formed in the substrate 100 to correspond to the tunneling region 101 and the erase region 102, respectively, provide a base where a memory cell may operate. The first well 101A and the second well 102A may be formed by ion-implanting an impurity into the substrate 100. The first well 101A and the second well 102A may be formed to be spaced apart from each other or to contact each other in one sidewall. When the first well 101A and the second well 102A are formed to contact each other in one sidewall, junction isolation may occur between them due to the difference in their conductive types. Herein, the bottom surface of the deep well (not shown) may be laid lower than the bottom surfaces of the first well 101A and the second well 102A, and it may be used to electrically isolate the first well 101A and the second well 102A from each other and provide a bias from the substrate 100 to a plurality of memory cells of a cell array.

The nonvolatile memory device in accordance with the embodiment of the present invention may include a selection gate SG, a floating gate FG, and a charge blocking layer 108. The selection gate SG is formed over the substrate 100 to overlap with the tunneling region 101. The floating gate FG is disposed adjacent to the selection gate SG with the gap 107 and overlaps with the tunneling region 101 and the erase region 102. The charge blocking layer 108 fills the gap 107. Herein, the selection gate SG performs a function of a control gate that couples the floating gate FG during a program operation, an erase operation, and a read operation and, at the same time, performs a function of preventing over-erase during the erase operation. The floating gate FG stores logic information, The selection gate SG and the floating gate FG are laid on the same plane, and they are simultaneously formed during a process for forming a logic gate. Therefore, it does not have to additionally perform a process for forming the selection gate SG that functions as the control gate. Since the selection gate SG performs a function of the control gate that couples the floating gate FG, the control gate formed over the floating gate FG is not required. That is, the select gate SG and the floating gate FG form a single gate.

The embodiments of the present invention provide a nonvolatile memory device that has an integration degree more improved than that of a conventional single gate Electrically Erasable Programmable Read-Only Memory (EEPROM) in a flash EEPROM, which is spotlighted among embedded memories, and includes selection gates for preventing over-erase.

The "floating gate FG disposed adjacent to the selection gate SG with the gap 107 between them" means that the floating gate FG and the selection gate SG have at least one sidewall facing each other. The gap 107, which is the space between the facing sidewalls of the selection gate SG and the floating gate FG, may have a uniform width, The gap 107 is to provide a space in which the charge blocking layer 108 (for example, an:IPD) for insulating the floating gate FG and the selection gate SG from each other is to be formed. Accordingly, the width of the gap 107 may be controlled in consideration of the design margin, forming processes and operation characteristics of a unit cell. To be specific, the width of the gap 107 may be controlled in consideration of the design rule of the unit cell, the coupling ratio between the selection gate SG and the floating gate FG, and so on. As the width of the gap 107 is decreased, the coupling ratio between the floating gate FG and the selection gate SG may be increased. Also, as the area of the facing sidewalls of the selection gate SG and the floating gate FG is increased, the coupling ratio between the floating gate FG and the selection gate SG may be increased.

The floating gate FG and the selection gate SG may have a bar shape or line shape extended in a direction intersecting with the tunneling region 101. The floating gate FG and the selection gate SG may be of a stack structure where a gate insulation layer 105 and a gate electrode 106 are stacked. The gate insulation layer 105 may include at least one selected from the group consisting of an oxide, a nitride, and an oxynitride. The gate electrode 106 may include a silicon-containing material, For example, the gate electrode 106 may include polysilicon. Herein, the polysilicon may be a doped polysilicon doped with an impurity of the second conductive type, or an undoped polysilicon that is not doped with any impurity. The embodiment of the present invention describes a case where the floating gate FG and the selection gate SG are planar gates, but the floating gate FG and the selection gate SG may have a three-dimensional gate structure, such as a fin gate structure.

The charge blocking layer 108 filling the gap 107 may include spacers 108 formed on the sidewalls of the floating gate FG and the selection gate SG. The charge blocking layer 108, in other words, the spacers 108, may include a dielectric substance. For example, the spacers 108 may include at least one selected from the group consisting of an oxide, a nitride, and an oxynitride. The dielectric substance used as the spacers 108 may be selected from diverse materials in consideration of the coupling ratio between the floating gate FG and the selection gate SG.

The nonvolatile memory device in accordance with the embodiment of the present invention may include a first junction region 111 of the second conductive type, which is formed in the tunneling region 101 adjacent to the selection gate SG, a second junction region 112 of the second conductive type, which is formed in the tunneling region 101 adjacent to the floating gate FG, and a third junction region 113 of the second conductive type, which is formed in the tunneling region 101 under the gap 107.

The first to third junction regions 111 to 113 may include an impurity region that is formed by ion-implanting an impurity into the substrate 100. The first junction region 111 may be a source region, and the second junction region 112 may be a drain region. The first junction region 111 and the second junction region 112 may have an LDD structure. The third junction region 113 performs a function of electrically connecting a channel region that is induced to the tunneling region 101 by the selection gate SG and the floating gate FG. The third junction region 113 may be formed when a low-concentration impurity region is formed during a process for forming the first junction region 111 and the second junction region 112 that have the LDD structure.

The nonvolatile memory device in accordance with the embodiment of the present invention may include a first inter-layer dielectric layer 115, a second inter-layer dielectric layer 116, first conductive lines 121, first contact plugs 125, second conductive lines 122, second contact plugs 126, third conductive lines 123, and third contact plugs 127. The first inter-layer dielectric layer 115 covers the selection gates SG and the floating gates FG, both of which are formed over the substrate 100. The second inter-layer dielectric layer 116 is disposed over the first inter-layer dielectric layer 115. The first conductive lines 121 are disposed over the first inter-layer dielectric layer 115. Each of the first contact plugs 125 electrically connects a first conductive line 121 to a first junction region 111 by penetrating through the first inter-layer dielectric layer 115. The second conductive lines 122 are disposed over the second inter-layer dielectric layer 116. Each of the second contact plugs 126 electrically connects a second conductive line 122 to a second junction region 112 by penetrating through the first inter-layer dielectric layer 115 and the second inter-layer dielectric layer 116. The third conductive lines 123 are disposed over the second inter-layer dielectric layer 116, Each of the third contact plugs 127 electrically connects the second well 102A of the erase region 102 to a third conductive line 123 by penetrating through the first inter-layer dielectric layer 115 and the second inter-layer dielectric layer 116. Also, although not illustrated in the drawing, the nonvolatile memory device may further include an impurity region of the second conductive type that is formed in each second well 102A under each third contact plug 127 and decreases the contact resistance between the third contact plug 127 and the second well 102A.

The first inter-layer dielectric layer 115 and the second inter-layer dielectric layer 116 may include at least one material selected from the group consisting of an oxide, a nitride, and oxynitride. The first conductive line 121 may be a source line SL, and the second conductive line 122 may be a bit line BL. The third conductive line 123 may be an erase line EL. The second conductive lines 122 and the third conductive lines 123 may be extended in a direction intersecting with the first conductive lines 121, and the second conductive lines 122 and the third conductive lines 123 may be arranged to be spaced apart in a direction that the first conductive lines 121 are extended. Although this embodiment of the present invention describes a case where the first conductive lines 121 are disposed over the first inter-layer dielectric layer 115, and the second conductive lines 122 and the third conductive lines 123 are disposed over the second inter-layer dielectric layer 116, the opposite case may be possible.

The nonvolatile memory device in accordance with the embodiment of the present invention may have increased degree of integration and operation characteristics by including the selection gate SG that functions as a control gate.

Also, since the coupling ratio is increased as the line width of the gap 107 between the selection gate SG and the floating gate FG is decreased in the nonvolatile memory device in accordance with the embodiment of the present invention, the operation characteristics and the degree of integration may be improved more and more as the degree of integration of the nonvolatile memory device is increased.

Hereafter, an example of a method for operating the nonvolatile memory device in accordance with the embodiment of the present invention is described by referring to the following Table 1. For the sake of convenience in description, the same reference numerals appearing in FIGS. 1, 2A and 2B are used.

TABLE 1

| Operation | Scheme | SG | 1st Junction Region 111 | 2nd Junction Region 112 | Erase Region 102 (2nd Well 102A) |
|---|---|---|---|---|---|
| Program | HCI | VPP | GND | VPP | Floating |
| Erase | FN tunneling | -VPP | GND | GND | VPP |
| Read | — | VCC | GND | Vread | GND |

First of all, the program operation may be performed using a Hot Carrier Injection (HCI) scheme, To be specific, when a pumping voltage VPP, a ground voltage GND, and the pumping voltage VPP are applied to the selection gate SG, the first junction region 111, and the second junction region 112, respectively, charges (which are electrons) are injected into the floating gate FG that overlaps with the tunneling region 101. In this way, the program operation may be performed in such a manner that the threshold voltage of the floating gate FG is increased. Herein, the pumping voltage VPP is obtained by boosting a power source voltage VCC that is supplied from an external device.

When the pumping voltage VPP is applied to the selection gate SG, a channel is formed in the substrate 100 under the selection gate SG, and at the same time, a voltage obtained by subtracting the coupling ratio between the floating gate FG and the selection gate SG from the pumping voltage VPP is applied to the floating gate FG, too, due to the selection gate SG. In short a voltage smaller than the pumping voltage VPP is applied to the floating gate FG so as to form a channel in the substrate 100 under the floating gate FG. Herein, the third junction region 113 couples two channels with each other, and the channel under the floating gate FG is pinched off due to the pumping voltage VPP that is applied to the second junction region 112. A memory cell may be programmed by implanting hot electrons generated in a pinch-off region into the floating gate FG and thus increasing the threshold voltage of the floating gate FG. The programming method of the HCI scheme described above is advantageous in that its program operation may be performed more easily than that of the FN tunneling scheme although the coupling ratio between the floating gate FG and the selection gate SG is small.

Subsequently, the erase operation may be performed through the FN Tunneling scheme. To be specific, when a negative pumping voltage-VPP, the ground voltage GND, the ground voltage GND, and the pumping voltage VPP are applied to the selection gate SG, the first junction region 111, the second junction region 112, and the erase region 102 that is the second well 102A, respectively, the charges in the inside of the floating gate FG leak out through the floating gate FG that overlaps with the erase region 102 so as to reduce the threshold voltage of the floating gate FG. In this way, data may be erased, According to another embodiment of the present invention, the second junction region 112 may not receive the ground voltage GND but may float.

When the negative pumping voltage-VPP is applied to the selection gate SG, a negative voltage smaller than the absolute value of the negative pumping voltage-VPP is applied to the floating gate FG. A data in a memory may be erased in such a manner that the electrons in the inside of the floating gate FG go through tunneling and are discharged outside due to the potential difference between the erase region 102 to which the pumping voltage VPP is applied and the floating gate FG to which the negative voltage is applied so as to decrease the threshold voltage of the floating gate FG. The erase operation method described above may have improved erase operation efficiency, compared with a Band To Band Tunneling method, and may suppress deterioration of the gate insulation layer 105. Also, since the tunneling region 101 and the erase region 102 are separated, the gate insulation layer 105 may be prevented from being deteriorated effectively. In short, the durability of the memory device may be improved.

Subsequently, a read operation is described. A read operation may be divided into a forward read operation and a reverse read operation. The forward read operation means that a read operation is performed through charge migration in the same direction as a migrating direction of charges during the program operation, and the reverse read operation means that a read operation is performed through charge migration in a direction opposite to a migrating direction of charges during the program operation.

Because the forward read operation may realize a cell array with a simple structure when compared to the reverse read operation, it provides advantages in terms of the degree of integration and the difficulty of processing. On the contrary, the reverse read operation has an advantage in that it has more tolerance to read disturbance than the forward read operation. The above Table 1 exemplarily presents a case of forward read operation.

The read operation may be performed by applying the power source voltage VCC, the ground voltage GND, and a read voltage Vread to the selection gate SG, the first junction region 111, and the second junction region 112, respectively. Since a voltage that is smaller than the power source voltage VCC applied to the selection gate SG, due to the coupling ratio between the floating gate FG and the selection gate SG, is applied to the floating gate FG, the tolerance to read disturbance may be improved even though the read operation is a forward read operation. The power source voltage VCC applied to the selection gate SG is a voltage that may turn on the selection gate SG. Performing a program operation (or an erase operation) may be decided based on whether there is a charge (i.e., electron) in the inside of the floating gate FG. The read voltage Vread may be lower than the power source voltage VCC.

Figure 3:
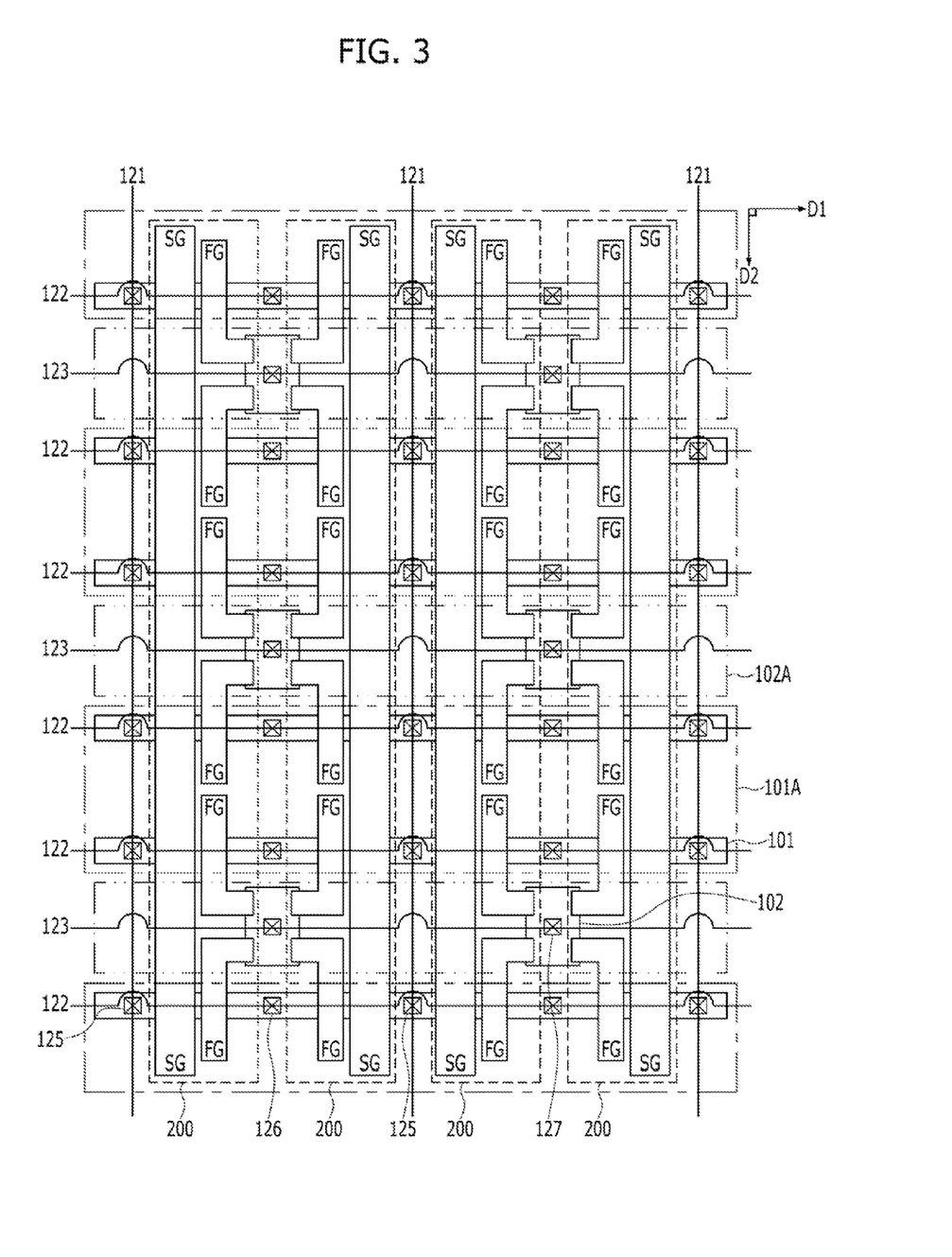
FIG. 3 is a plan view illustrating a cell array of a nonvolatile memory device in accordance with an embodiment of the present invention.

FIG. 3 is a plan view illustrating a cell array of a nonvolatile memory device in accordance with an embodiment of the present Invention. For the sake of convenience in description, the same reference numerals appearing in FIGS. 1, 2A and 28 are used.

Referring to FIG. 3, the nonvolatile memory device in accordance with the embodiment of the present invention may include a plurality of tunneling regions 101, a plurality of erase regions 102, and a plurality of gate lines 200. The tunneling regions 101 are extended in a first direction D1 and arranged to be spaced apart from each other in a second direction D2 that intersects with the first direction. The erase regions 102 are disposed between the tunneling regions 101, in the second direction, and spaced apart from each other in the first direction. The gate lines 200 are extended in the second direction and spaced apart from each other in the first direction.

The tunneling regions 101 and the erase regions 102 are defined by an isolation layer that is formed in the substrate 100. The first wells 101A of the first conductive type and the second wells 102A of the second conductive type are formed in the substrate 100 to correspond to the tunneling regions 101 and the erase regions 102, respectively. Each of the first wells 101A and each of the second wells 102A are extended in the first direction, and the first wells 101A and the second wells 102A may be arranged to be spaced apart from each other in the second direction. Herein, the first wells 101A and the second wells 102A may be alternately disposed in the second direction.

The tunneling regions 101 arranged in the second direction may share one first well 101A. For example, a pair of (or two) tunneling regions 101 disposed in the second direction may share one first well 101A. The erase regions 102 may share one second well 102A, and the erase regions 102 sharing one second well 102A may be arranged to be spaced apart from each other in the first direction. For example, the erase regions 102 may be disposed between the gate lines 200, in the first direction.

Each of the gate lines 200 is may include a selection gate SG extended in the second direction and going across the tunneling regions 101, a plurality of floating gates FG disposed adjacent to the selection gate SG with the gap 107 and overlapping with the tunneling regions 101 and the erase regions 102, and a charge blocking layer 108 filling the gap 107.

The floating gates FG may be disposed adjacent to the selection gate SG with the gap 107 between them, and they may overlap with the tunneling regions 101 that the selection gate SG goes across to respectively correspond to the tunneling regions 101. Also, the floating gates FG may overlap with the erase regions 102 disposed between the tunneling regions 101. The neighboring floating gates FG may overlap with one erase region 102. in other word, the neighboring floating gates FG may share one erase region 102. For example, two floating gates FG that are adjacent in the second direction may share one erase region 102. The charge blocking layer 108 filling the gap 107 may include spacers 108 that are formed on the sidewalls of the selection gate SG and the floating gates FG.

Among the gate lines 200, two gate lines 200 that are adjacent to each other in the first direction may have floating gates FG or selection gates SG, arranged to face each other. Therefore, the gate lines 200 may be disposed in such a manner that a pair of gate lines 200 has floating gates FG facing each other or has selection gates SG facing each other. Herein, the erase regions 102 may be disposed between the pair of gate lines 200 having floating gates FG facing each other. For example, the floating gates of one gate line of the pair of gate lines and the floating gates of the other gate line of the pair of gate lines face each other, and the erase regions are disposed between the floating gates of one gate line of the pair of gate lines and the floating gates of the other gate line of the pair of gate lines. Therefore, the floating gates FG facing each other in the first direction and the floating gates FG facing each other in the second direction may share one erase region 102. In short, four floating gates FG may share one erase region 102.

The first junction region 111 may be disposed in the tunneling region 101 between the pair of gate lines 200 having selection gates SG facing each other. The second junction region 112 may be disposed in the tunneling region 101 between the pair of gate lines 200 having floating gates FG facing each other. The neighboring gate lines 200 may share the first junction region 111 and the second junction region 112.

The first conductive lines 121 is extended in the second direction and disposed to be spaced apart from each other in the first direction. The first conductive lines 121 may be source lines, and they may be coupled with the first junction region 111 through the first contact plugs 125. The second conductive lines 122 and the third conductive lines 123 may be extended in the first direction and disposed to be spaced apart from each other in the second direction. A pair of the second conductive line 122 and the third conductive line 123 may be disposed in the second direction so that the second conductive lines 122 and the third conductive lines 123 may be disposed alternately, The second conductive lines 122 may be bit lines, and the second conductive lines 122 may be coupled with the second junction region 112 through the second contact plugs 126. The third conductive lines 123 may be erase lines, and the third conductive lines 123 may be coupled with the erase region 102, i.e., the second well 102A, through the third contact plugs 127.

The nonvolatile memory device in accordance with the embodiment of the present invention may have improved degree of integration and operation characteristics, as the selection gate SG functions as a control gate.

Also, since the floating gates FG share one erase region 102, the degree of integration may be improved further.

According to an embodiment of the present invention, the integration degree and operation characteristics of a device may be improved as selection gates function as control gates.

Also, since the floating gates share one erase region, the integration degree of the device may be improved even more.

In addition, since a tunneling region where a program operation is performed and an erase region where an erase operation is performed are provided separately, the operation characteristics as well as durability of the device may be improved further more.

While the present invention has been described with respect to the specific embodiments, it will be apparent to those skilled in the art that various changes and modifications may be made without departing from the spirit and scope of the invention as defined in the following claims.

What is claimed is:
1. A nonvolatile memory device, comprising:
a plurality of tunneling regions that are extended in a first direction and arranged to be spaced apart from each other in a second direction intersecting with the first direction;
a plurality of erase regions disposed between the tunneling regions, in the second direction; and
a plurality of gate lines that are extended in the second direction and arranged to be spaced apart from each other in the first direction,
wherein each of the gate lines includes a selection gate going across the tunneling regions, a plurality of floating gates disposed to be adjacent to the selection gate with a gap therebetween and to overlap with the tunneling regions and the erase regions, and a charge blocking layer filling the gap,
wherein the selection gate performs a function of a control gate that couples the floating gate,
wherein, in each of the gate lines, the floating gates overlap with the tunneling regions that the selection gate goes across,
wherein two of the floating gates overlapping with the tunneling regions on both sides of each erase region in the second direction share a corresponding erase region.
2. The nonvolatile memory device of claim 1, further comprising:
a plurality of first wells to correspond to the tunneling regions; and
a plurality of second wells to correspond to the erase regions and having a conductive type complementary to a conductive type of the first wells.
3. The nonvolatile memory device of claim 2, wherein the tunneling regions share one first well, and
the first wells and the second wells are alternately arranged in the second direction.

4. The nonvolatile memory device of claim 2, wherein the erase regions share one second well and are disposed between the gate lines.

5. The nonvolatile memory device of claim 1, wherein among the gate lines, a pair of gate lines disposed adjacent to each other in the first direction has floating gates facing each other or selection gates facing each other.

6. The nonvolatile memory device of claim 5, wherein the erase regions are disposed between the pair of gate lines having floating gates facing each other.

7. The nonvolatile memory device of claim 6, wherein the floating gates of one gate line of the pair of gate lines and the floating gates of the other gate line of the pair of gate lines face each other and share the erase regions that are disposed between the floating gates of one gate line of the pair of gate lines and the floating gates of the other gate line of the pair of gate lines.

8. The nonvolatile memory device of claim 1, wherein each selection gate has a sidewall that faces a sidewall of at least one floating gate.

9. The nonvolatile memory device of claim 1, wherein the floating gates are coupled in response to a bias that is applied to the selection gates.

10. The nonvolatile memory device of claim 1, wherein the charge blocking layer includes spacers formed on sidewalls of the selection gates and the floating gates.

11. The nonvolatile memory device of claim 1, further comprising:
   a first junction region formed in the tunneling regions between a pair of gate lines of which a selection gate of one gate line faces a selection gate of the other gate line, in the first direction;
   a second junction region formed in the tunneling regions between a pair of gate lines of which floating gates of one gate line faces floating gates of the other gate line in the first direction;
   a first conductive line extended in the second direction and coupled with the first junction region;
   a second conductive line extended in the first direction and coupled with the second junction region; and
   a third conductive line extended in the first direction and coupled with the erase regions.

12. The nonvolatile memory device of claim 11, wherein the third conductive lines and the second conductive lines are alternately disposed in the second direction.

13. The nonvolatile memory device of claim 1, wherein the selection gate and the floating gate are disposed on the same plane.

* * * * *